United States Patent [19]
Seo et al.

[11] Patent Number: 6,055,194
[45] Date of Patent: Apr. 25, 2000

[54] METHOD AND APPARATUS FOR CONTROLLING COLUMN SELECT LINES IN A SYNCHRONOUS MEMORY DEVICE

[75] Inventors: Dong-il Seo, Kyungki-do; Sei-seung Yoon, Seoul, both of Rep. of Korea

[73] Assignee: Samsung Electronics, Co., Ltd., Suwon, Rep. of Korea

[21] Appl. No.: 09/052,791

[22] Filed: Mar. 31, 1998

[30] Foreign Application Priority Data

Mar. 31, 1997 [KR] Rep. of Korea ............... 97-11826

[51] Int. Cl.[7] ........................................... G11C 7/00
[52] U.S. Cl. .................. 365/194; 365/230.06; 365/233
[58] Field of Search ................................ 365/194, 233, 365/230.06

[56] References Cited

U.S. PATENT DOCUMENTS

| | | | |
|---|---|---|---|
| 5,835,446 | 11/1998 | Park | 365/233 |
| 5,848,024 | 12/1998 | Cho | 365/230.06 |
| 5,872,742 | 2/1999 | Kengeri et al. | 365/233 |
| 5,881,017 | 3/1999 | Matsumoto et al. | 365/230.04 |
| 5,883,855 | 3/1999 | Fujita | 365/238.5 |
| 5,946,266 | 8/1999 | Iwamoto et al. | 365/233 |

OTHER PUBLICATIONS

"A 2.5ns Clock Access 250MHz 256Mb SDRAM with a Synchronous Mirror Delay," Takanori Saeki, et al., 1996 IEEE International Solid–State Circuits Conference Digest of Technical Papers, pp. 374–375.

*Primary Examiner*—David Nelms
*Assistant Examiner*—Hien Nguyen
*Attorney, Agent, or Firm*—Marger Johnson & McCollom, P.C.

[57] ABSTRACT

A column select line control circuit for a synchronous semiconductor memory device increases the time margin for writing input data to memory cells in prefetch mode by delaying the disablement of the column select lines during a write operation, thereby extending the time for writing data to the cells. The control circuit includes a column select line control circuit that generates enable and disable signals in response to an internal clock signal, and a column decoder that enables and disables a column select line in response to the enable and disable signals. In pipeline mode, the column select line control circuit generates the disable signal by delaying the internal clock signal and generates the enable signal by delaying and inverting the internal clock signal. In prefetch mode, the column select line control signal adds an additional delay to both the enable and disable signals, but only during write operations.

20 Claims, 8 Drawing Sheets

METHOD AND APPARATUS FOR CONTROLLING COLUMN SELECT LINES IN A SYNCHRONOUS MEMORY DEVICE

This application corresponds to Korean patent application No. 97-11826 filed Mar. 31, 1997 in the name of Samsung Electronics Co., Ltd., which is herein incorporated by reference for all purposes.

BACKGROUND OF THE INVENTION

1. Field of the Invention

This invention relates generally to synchronous semiconductor memory devices, and more particularly, to a method and apparatus for controlling column select lines in a synchronous memory device.

2. Description of the Related Art

A Synchronous DRAM generally operates in either a pipeline mode or a prefetch mode. In a synchronous DRAM operating in a pipeline mode, an address and a command are input from outside the chip during each cycle of the system clock, and a different column selection line, which is selected by a column address, is enabled during each cycle of the system clock. However, a disadvantage of a synchronous DRAM operating in a pipeline mode is that it may malfunction when used with a system clock having a relatively high frequency.

Synchronous DRAM can be operated in a prefetch mode in an attempt to guarantee operation of the DRAM with a high frequency system clock. In a synchronous DRAM having a prefetch structure, an address and a command are input from the outside the chip once during every two cycles of the system clock, and at least two column selection lines, which are selected by at least two column addresses, are enabled at the same time during two cycles of the system clock. Such an operation is usually referred to as a 2N rule or 2-bit prefetch.

Figure 1:
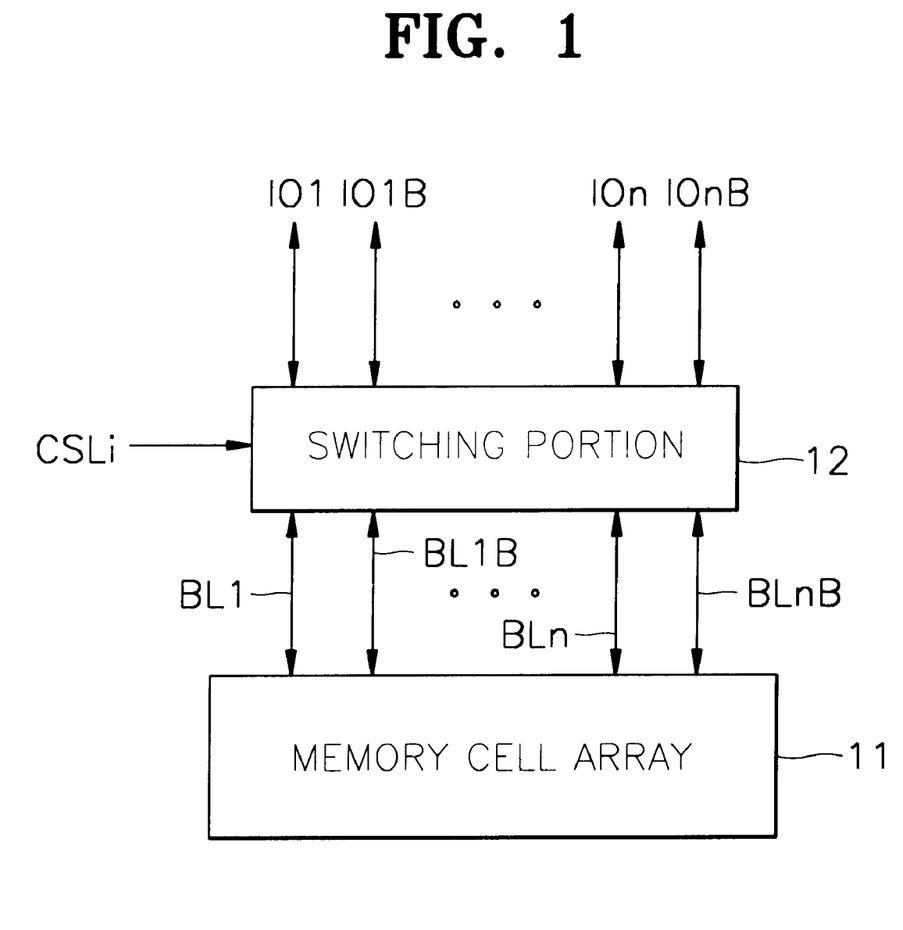
FIG. 1 is a schematic diagram for explaining the function of a column selection line in a synchronous DRAM.

FIG. 1 is a block diagram for explaining the function of a column selection line in a synchronous DRAM. Referring to FIG. 1, a memory cell array 11 is comprised of a plurality of memory cells for storing data transmitted through each of bit line pairs BLi and BLiB (wherein "i" is from 1 to n). A switching portion 12 connects the respective bit line pairs (BLi and BLiB) to each of input/output line pairs IOi and IOiB (wherein "i" is from 1 to n) when column selection line CSLi is enabled. Thus, during a read operation, data stored in the memory cells of the memory cell array 11 is output to the outside of the chip by sequentially passing through the bit line pair, the switching portion 12 and the input/output line pair. In a write operation, data from outside of the chip passes sequentially through the input/output pair, the switching portion 12 and the bit line pair and then is stored in the memory cell of the memory cell array 11. The switching portion 12 is comprised of NMOS transistors in which the gate of each NMOS transistor is connected to CSLi, one of either the source or drain thereof is connected to the bit line, and the remaining one of the source or drain is coupled to the input/output line. These NMOS transistors are usually referred to as column selection gates.

Figure 2:
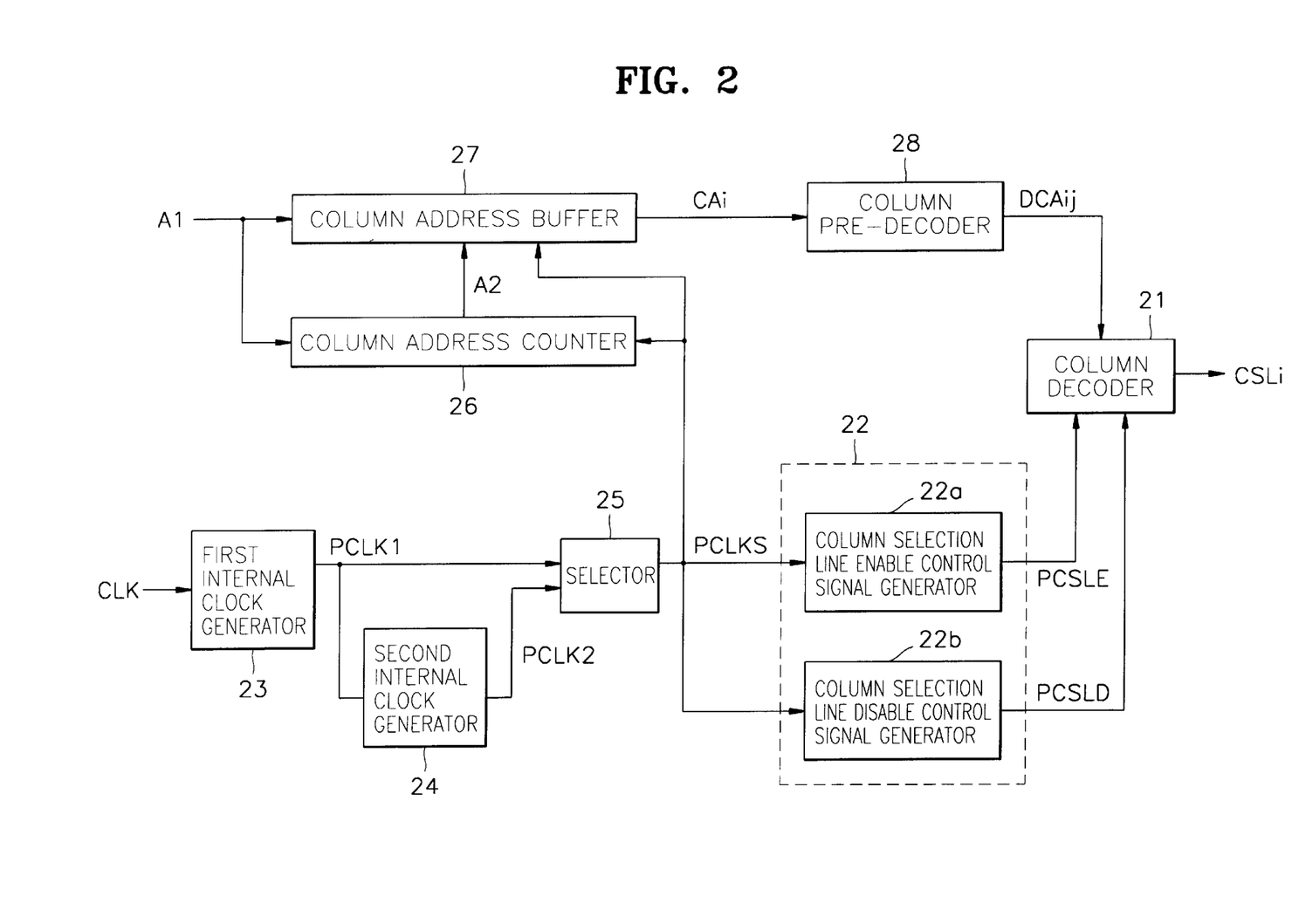
FIG. 2 is a block diagram of a prior art column selection line control circuit for a synchronous DRAM.

FIG. 2 is a block diagram showing a prior art circuit for controlling a column selection line in a synchronous DRAM.

Referring to FIG. 2, the conventional circuit for controlling a column selection line includes a column decoder 21, a column selection line controller 22, a first internal clock generator 23, a second internal clock generator 24, a selector 25, a column address counter 26, a column address buffer 27, and a column pre-decoder 28. The column selection line controller 22 is composed of a column selection line enable control signal generator 22a and a column selection line disable control signal generator 22b. In FIG. 2, "CSLi" represents a column selection line, "A1" a column address input from outside of the chip, "A2" an increased column address, "CAi" a buffered address, "DCAij" a pre-decoded address, and "CLK" an external clock input from outside of the chip. Also, "PCLK1" and "PCLK2" represent first and second internal clocks, respectively, and "PCLKS" represents an internal clock selected from PCLK1 and PCLK2. "PCSLE" is a column selection line enable control signal, and "PCSLD" is a column selection line disable control signal.

Figure 3:
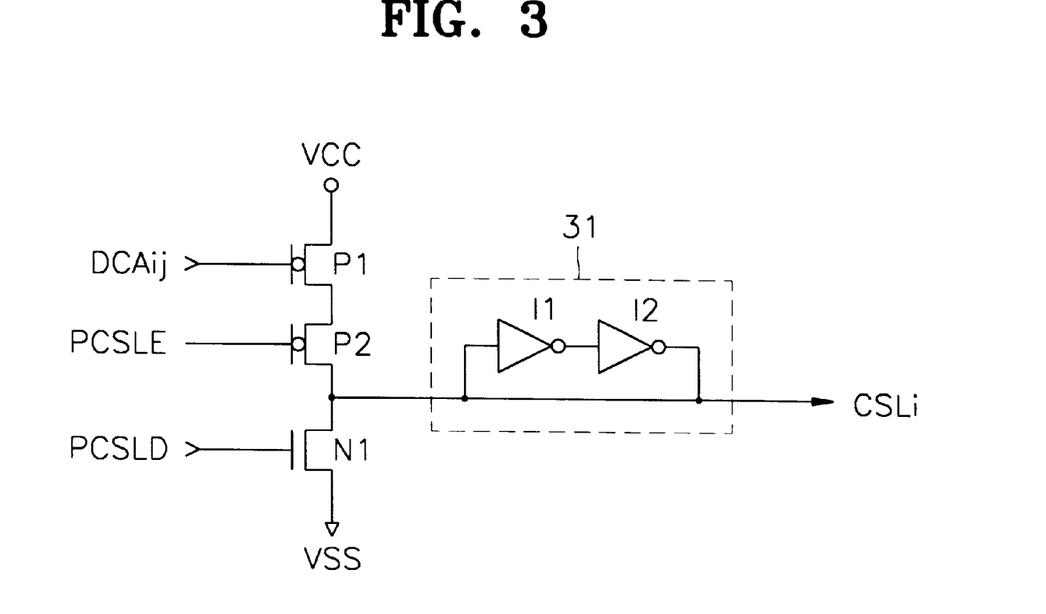
FIG. 3 is a circuit diagram of the column decoder in the column selection line control circuit shown in FIG. 2.

FIG. 3 is a circuit diagram showing a column decoder of the column selection line control circuit shown in FIG. 2. Referring to FIG. 3, the column decoder includes a PMOS transistors P1 and P2, and NMOS transistor N1. Transistor P1 has a source to which a power supply voltage VCC is applied and a gate to which the pre-decoded address DCAij is applied. PMOS transistor P2 has a source which is connected to the drain of PMOS transistor P1, a gate to which the column selection line enable control signal PCSLE is applied and a drain which is connected to the column selection line CSLi. NMOS transistor N1 has a drain which is connected to the column selection line CSLi, a gate to which the column selection line disable control signal PCSLD is applied and a source to which a ground voltage VSS is applied. The column decoder of FIG. 3 also includes a line latch 31 for storing a signal transmitted to the column selection line CSLi. The line latch 31 includes a first inverter 11 for inverting a signal transmitted to the column selection line CSLi and a second inverter 12 for inverting the output signal of the first inverter 11 and outputting the inverted signal to the column selection line CSLi.

Figure 4:
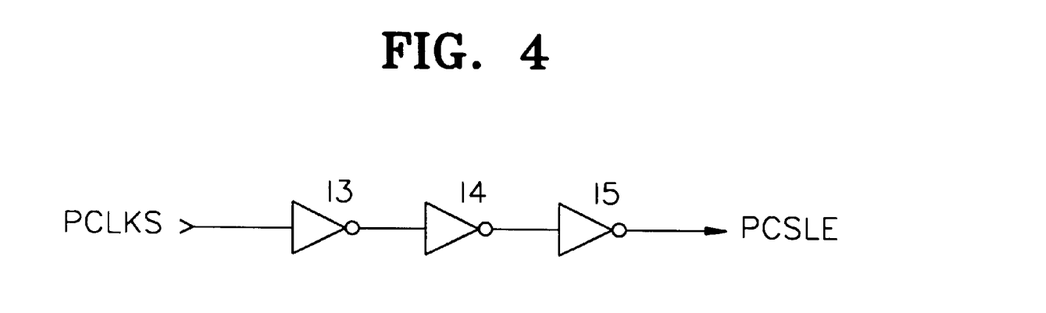
FIG. 4 is a circuit diagram of the column selection line enable control signal generator in the column selection line control circuit shown in FIG. 2.

FIG. 4 is a circuit diagram showing the column selection line enable control signal generator of the column selection line control circuit shown in FIG. 2. Referring to FIG. 4, the column selection line enable control signal generator, which operates as a sort of inverting-delay device, includes a first inverter 13 for inverting the internal clock PCLKS, a second inverter 14 for inverting the output of the first inverter 13, and a third inverter 15 for inverting the output signal of the second inverter 14 and outputting the column selection line enable control signal PCSLE.

Figure 5:
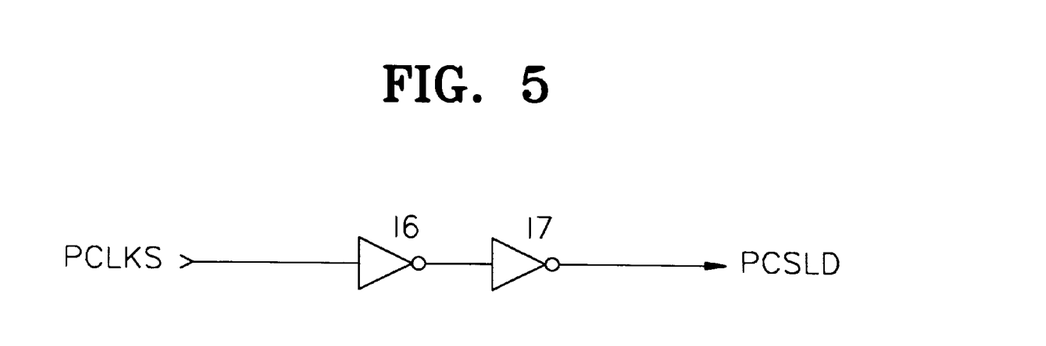
FIG. 5 is a circuit diagram of the column selection line disable control signal generator in the column selection line control circuit shown in FIG. 2.

FIG. 5 is a circuit diagram showing the column selection line disable control signal generator of the column selection line control circuit shown in FIG. 2. Referring to FIG. 5, the column selection line disable control signal generator, which operates as a sort of delaying device, includes a first inverter 16 for inverting the internal clock PCLKS, a second inverter 17 for inverting the output of the first inverter 16 and outputting the column selection line disable control signal PCSLD.

Figure 6:
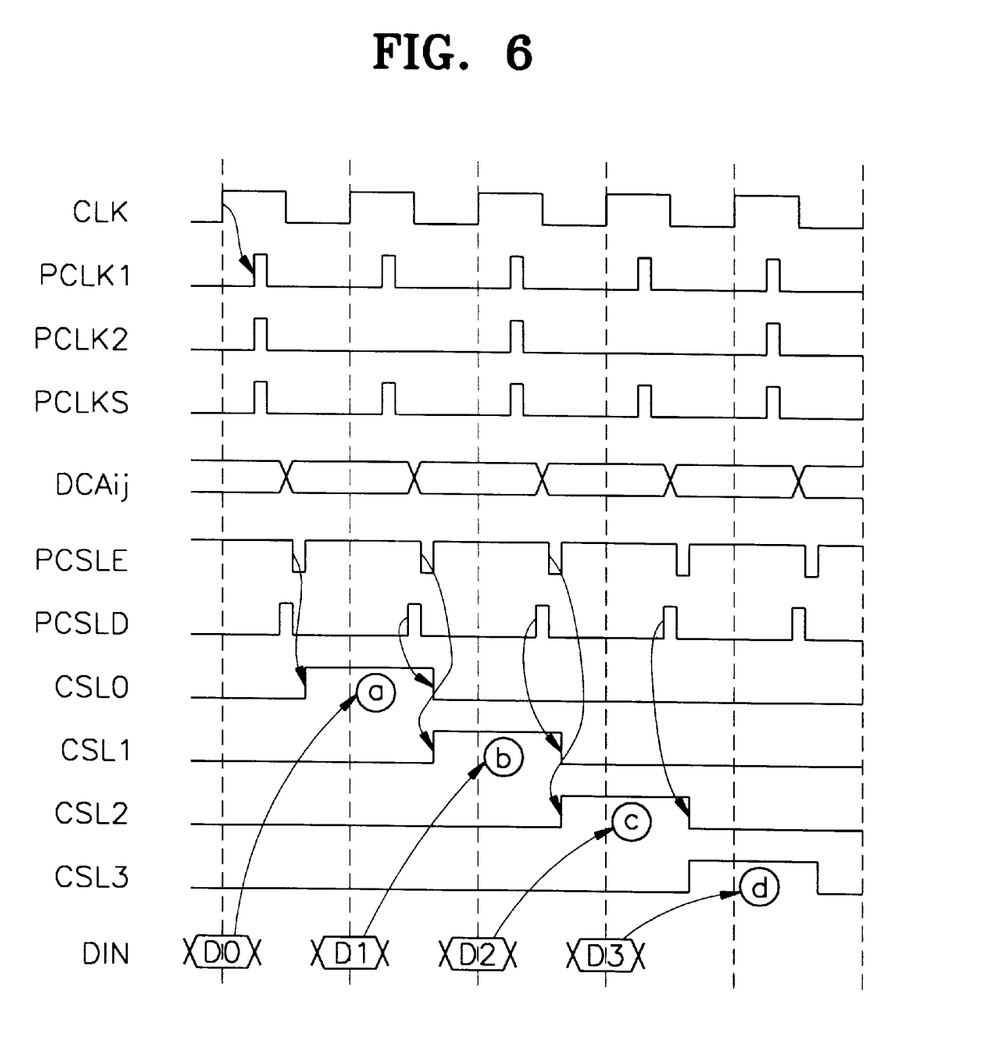
FIG. 6 is a timing diagram showing the operation of the column selection line control circuit shown in FIG. 2 when the synchronous DRAM operates in pipeline mode.

FIG. 6 is a timing diagram showing the operation of the column selection line control circuit shown in FIG. 2 when a synchronous DRAM operates in a pipeline mode. Referring to FIG. 6, when the synchronous DRAM operates in a pipeline mode, the first internal clock PCLK1 is selected as the internal clock PCLKS. Also, a single column selection line is enabled during each cycle of the external clock CLK. That is, each of the column selection lines CSL0, CSL1, CSL2 and CSL3 is consecutively maintained in an enabled state for one cycle.

In a write cycle in the pipeline mode, input data DIN, i.e., D0, D1, D2, and D3 are sequentially input to the chip at each rising edge of the external clock CLK, and when the respective column selection lines CSL0, CSL1, CSL2 and CSL3 are enabled, the data D0, D1, D2 and D3 are consecutively stored in memory cells corresponding to the respective column selection lines CSL0, CSL1, CSL2 and CSL3 via a predetermined route not shown in FIG. 2.

Figure 7:
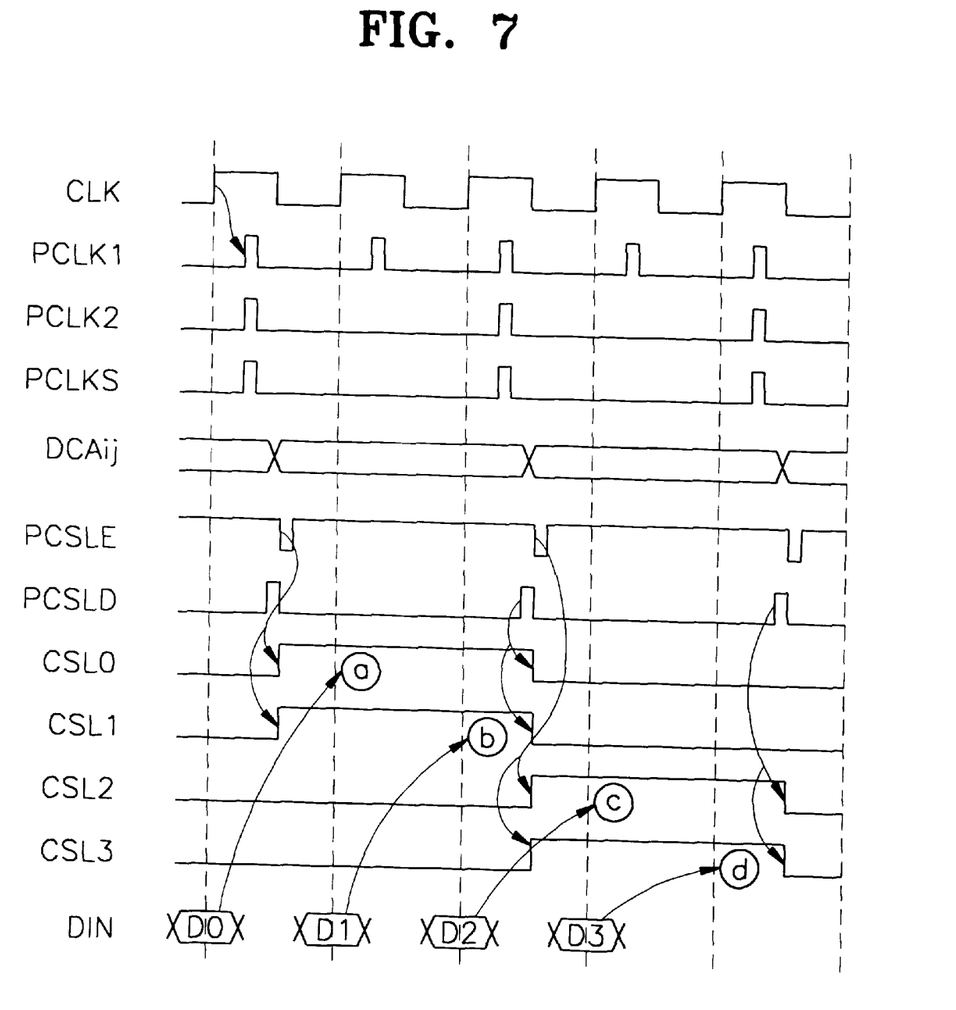
FIG. 7 is a timing diagram showing the operation of the column selection line control circuit shown in FIG. 2 when the synchronous DRAM operates in a 2-bit prefetch mode.

FIG. 7 is a timing diagram showing the operation of the column selection line control circuit shown in FIG. 2 when the synchronous DRAM operates in a 2-bit prefetch mode.

Referring to FIG. 7, when the synchronous DRAM operates in a 2-bit prefetch mode, the second internal clock PCLK2, which has twice the cycle time of the first internal clock PCLK1, is selected as the internal clock PCLKS. Also, two column selection lines are enabled at the same time and remain enabled during two cycles of the external clock CLK. That is, the column selection lines CSL0 and CSL1 are enabled for the initial two cycles of the external clock CLK and the column selection lines CSL2 and CSL3 are enabled for the next two cycles of the external clock CLK. Accordingly, since the operational frequency inside the chip is reduced to half the frequency of the external clock CLK, the time margin for reading data from a memory cell increases when the synchronous DRAM operates in the 2-bit prefetch mode.

During a write cycle in the 2-bit prefetch mode, as in a write cycle in the pipeline mode as shown in FIG. 6, input data DIN, i.e., D0, D1, D2 and D3, are consecutively input to the chip at each rising edge of the external clock CLK. Also, as described previously, in the 2-bit prefetch mode, both CSL0 and CSL1 are enabled at the same time for the initial two cycles of the external clock CLK, and both CSL2 and CSL3 are concurrently enabled for another next two cycles of the external clock CLK.

D0, D1, D2 and D3, Which pass through a predetermined route not shown in FIG. 2, are delayed for a predetermined time. Thus, in the case of D0 and D2, since a write action begins at the beginning portion (areas "a" and "c") of the time period during which column selection lines CSL0 and CSL2 are enabled, there is sufficient time for writing to the memory cells. However, in the case of D1 and D3, since a write action begins at the end portion (areas "b" and "d") of the time period during which column selection lines CSL1 and CSL3 are enabled, there is barely adequate time for writing to the memory cells.

Therefore, with a conventional column selection line control circuit, as the external clock, i.e., the system clock, becomes faster, the time margin for writing the memory cells in the write cycle of a 2-bit prefetch structure gradually becomes inadequate.

Accordingly, a need remains for an improved scheme for controlling column select lines in synchronous semiconductor memory device.

SUMMARY OF THE INVENTION

Therefore, it is an object of the present invention to increase the time margin for write operations in a synchronous semiconductor memory device.

Another object of the present invention is to improve the reliability of a synchronous semiconductor memory device.

A further object of the present invention is to increase the operating speed of a synchronous semiconductor memory device.

To accomplish these and other objects, a column select line control circuit for a synchronous semiconductor memory device increases the time margin for writing input data to memory cells in prefetch mode by delaying the disablement of the column select lines during a write operation, thereby extending the time for writing data to the cells. The control circuit includes a column select line control circuit that generates enable and disable signals in response to an internal clock signal, and a column decoder that enables and disables a column select line in response to the enable and disable signals. In pipeline mode, the column select line control circuit generates the disable signal by delaying the internal clock signal and generates the enable signal by delaying and inverting the internal clock signal. In prefetch mode, the column select line control signal adds an additional delay to both the enable and disable signals, but only during write operations.

One aspect of the present invention is a method for controlling a column select line in a synchronous semiconductor memory device, the method comprising: enabling the column select line, thereby selecting a memory cell; writing to the selected memory cell while the column select line is enabled; generating a column select line disable signal responsive to an external clock signal; disabling the column select line responsive to the column select line disable signal; and delaying the column select line disable signal, thereby extending the time for writing to the memory cell. The method can further include: generating a column select line enable signal responsive to the external clock signal; enabling the column select line responsive to the column select line enable signal; and delaying the column select line enable signal. In a preferred embodiment, the enable and disable signals are delayed only during a write operating when the memory device is operating in a prefetch mode.

Another aspect of the present invention is a column select line control circuit for a synchronous semiconductor memory device comprising: a column decoder for enabling a column select line responsive to a column address and disabling the column select line responsive to a column select line disable signal; a column select gate coupled to the column decoder to select a memory cell responsive to the column select line; and a disable signal generator coupled to the column decoder for generating the column select line disable signal responsive to a clock signal; wherein the disable signal generator delays the column select line disable signal during a write operation, thereby extending the time for writing to the memory cell. The column decoder enables the column select line responsive to a column select line enable signal, and the column select line control circuit further can further include an enable signal generator coupled to the column decoder for generating the column select line enable signal responsive to the clock signal.

In a preferred embodiment, the column select line control circuit further includes: a first internal clock generator for generating a first clock signal responsive to an external clock signal; a second internal clock generator for generating a second clock signal responsive to the external clock signal; and a selector circuit coupled to the first internal clock generator, the second internal clock generator, and the disable signal generator for selecting the first clock signal when the memory device operates in a pipeline mode, or the second clock signal when the memory device operates in a prefetch mode, and supplying the selected clock signal to the disable signal generator as the clock signal.

The disable signal generator includes: a first delay circuit having an input coupled to receive the clock signal, and an output; a second delay circuit having an input coupled to the output of the first delay circuit, and an output; and a selector circuit having a first input coupled to the output of the first delay circuit, a second input coupled to the output of the second delay circuit, an output coupled to the column decoder to provide the column select line disable signal thereto, wherein the selector circuit couples the output from either the first delay circuit or the second delay circuit to the column decoder depending on the state of a control signal.

A further aspect of the present invention is a column select line control circuit for a semiconductor memory device comprising: a column decoder for driving a column select line responsive to an address signal, an enable signal, and a disable signal; and a column select line controller coupled to the column decoder for generating the enable signal and the disable signal responsive to an internal clock signal; wherein the column select line controller delays the assertion of the enable signal and the disable signal.

An advantage of the present invention is that it increases the time margins for writing to a memory cell in a synchronous semiconductor memory device in prefetch mode, while not changing the timing characteristics of read operations in prefetch mode or any operations in pipeline mode.

The foregoing and other objects, features and advantages of the invention will become more readily apparent from the following detailed description of a preferred embodiment of the invention which proceeds with reference to the accompanying drawings.

DETAILED DESCRIPTION

Figure 8:
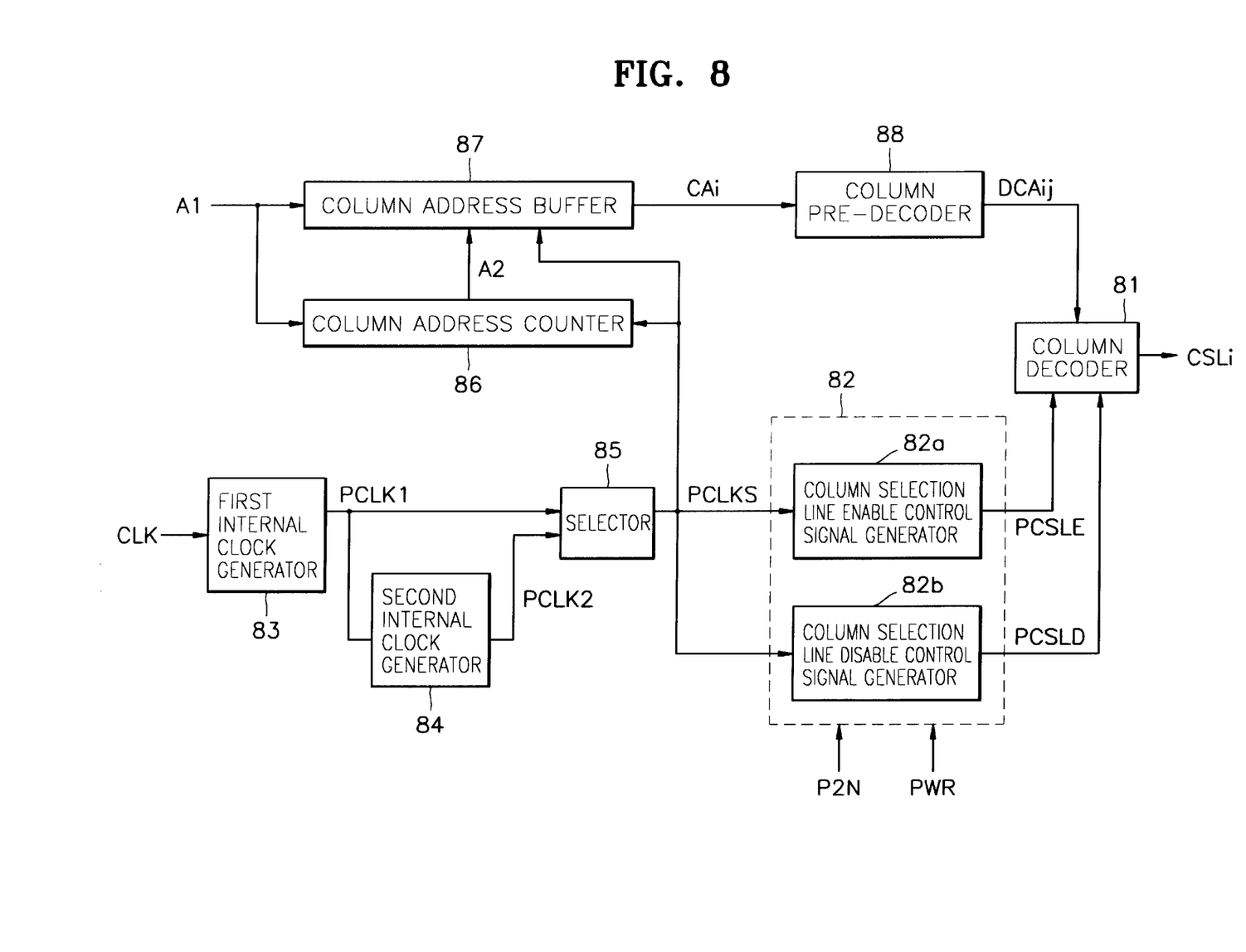
FIG. 8 is a block diagram illustrating a column selection line control circuit for a synchronous DRAM according to the present invention.

Referring to FIG. 8, a column selection line control circuit according to the present invention includes a column decoder 81, a column selection line controller 82, a first internal clock generator 83, a second internal clock generator 84, a selector 85, a column address counter 86, a column address buffer 87, and a column pre-decoder 88.

The column decoder 81 drives a column selection line CSLi in response to a pre-decoded address DCAij, a column selection line enable control signal PCSLE, and a column selection line disable control signal PCSLD. In devices in which a memory device includes structure that allows it to operate in both a pipeline mode and a prefetch (2-bits or more) mode, the column selection line controller 82 receives the internal clock PCLKS and generates the column selection line enable control signal PCSLE and the column selection line disable control signal PCSLD in response to first and second control signals P2N and PWR in order to delay times at which the column selection line CSLi is enabled and disabled during a write cycle in 2-bit prefetch mode.

To delay the enabling and disabling of the column selection line CSLi during both read and write cycles in 2-bit prefetch mode, the column selection line controller 82 can be configured to generate the column selection line enable control signal PCSLE and the column selection line disable control signal PCSLD in response to the first control signal P2N only. If the synchronous DRAM includes structure that only allows it to operate in a 2-bit or more prefetch mode, the column selection line controller 82 can be configured to generate the column selection line enable control signal PCSLE and the column selection line disable control signal PCSLD in response to the second control signal PWR only.

The column selection line controller 82 includes a column selection line enable control signal generator 82a and a column selection line disable control signal generator 82b which receive the internal clock PCLKS and generate the column selection line enable control signal PCSLE and the column selection line disable control signal PCSLD, respectively, in response to the first and second control signals P2N and PWR. The first control signal P2N becomes active (logic "high") when the synchronous DRAM operates in the 2-bit prefetch mode, and the second control signal PWR becomes active (logic "high") during a write cycle in the 2-bit prefetch mode. Both signals are generated by a control circuit (not shown).

The first internal clock generator 83 receives an external clock CLK from outside of the chip, i.e., a system clock, and generates a first internal clock PCLK1 having the same frequency as the external clock CLK. The second internal clock generator 84 receives the first internal clock PCLK1 and generates a second internal clock PCLK2 having a frequency that is half the frequency of the first internal clock PCLK1. The selector 85 selects either the first internal clock PCLK1 or the second internal clock PCLK2 as the internal clock PCLKS.

When the synchronous DRAM operates in pipeline mode, the selector 85 selects the first internal clock PCLK1 as the internal clock PCLKS in response to a predetermined control signal, and when the synchronous DRAM operates in a 2-bit prefetch mode, the selector 85 selects the second internal clock PCLK2 as the internal clock PCLKS in response to a predetermined control signal. The column address counter 86 receives a column address A1 input from outside of the chip and generates a column address A2 which is one greater than A1 in response to the internal clock PCLKS. Thus, when the synchronous DRAM operates in pipeline mode, the column address counter 86 receives the first internal clock PCLK1 as the internal clock PCLKS so that a higher column address A2 is generated for each cycle of the external clock CLK.

When the synchronous DRAM operates in a 2-bit prefetch mode, the column address counter 86 receives the second internal clock PCLK2 as the internal clock PCLKS so that a column address A2 which is one greater than A1 is generated for every two cycles of the external clock CLK. The column address buffer 87 buffers the column address A1 and the increased column address A2 and generates a bufferred address CAi. The column pre-decoder 88 performs pre-decoding the bufferred address CAi and generates the pre-decoded address DCAij.

Figure 9:
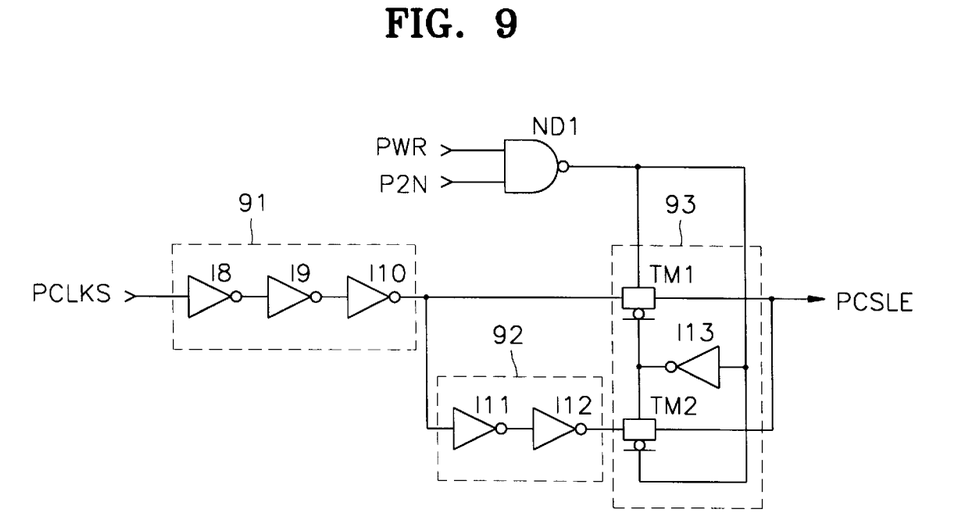
FIG. 9 is a circuit diagram of the column selection line enable control signal generator in the column selection line control circuit shown in FIG. 8.

Referring to FIG. 9, the column selection line enable control signal generator includes a first inverting delayer 91 for inverting and delaying the internal clock PCLKS, a first delayer 92 for delaying the output signal from the first inverting delayer 91, a first logic means ND1 for performing a logical operation in response to the first and second control signals P2N and PWR, and a first selector 93 for selecting one of the output signals from the first inverting delayer 91 and the first delayer 92 in response to the output signal from the first logic means ND1 and outputting the column selection line enable control signal PCSLE.

The first inverting delayer 91 includes an invertor 18 for inverting the internal clock PCLKS, an invertor I9 for inverting the output signal of the invertor I8, and an invertor I10 for inverting the output signal of the invertor I9. The first delayer 92 includes an invertor I11 for inverting the output signal of the invertor I10 and an invertor I12 for inverting the output signal of the invertor I11. The first logic means ND1 is a NAND gate for performing a NAND operation on the first and second control signals P2N and PWR. The first selector 93 includes a first switching means TM1 for outputting the output signal of the first inverting delayer 91 as the column selection line enable control signal PCSLE in response to the output signal of the first logic means ND1, and a second switching means TM2 for outputting the output signal of the first delayer 92 as the column selection line enable control signal PCSLE in response to the inverted output signal of the first logic means ND1. The first and second switching means TM1 and TM2 are transmission gates.

The operation of the column selection line enable control signal generator will now be described. When the synchronous DRAM operates as in pipeline mode, the first control signal P2N is "low". Accordingly, the output signal from the first logic means ND1 is "high", and the first switching means TM1 turns on while the second switching means turns off. Thus, the internal clock PCLKS is inverted and delayed by the first inverting delayer 91 and the output signal of the first inverting delayer 91 is output as the column selection line enable control signal PCSLE.

When the synchronous DRAM operates in a 2-bit prefetch mode, the first control signal P2N is "high", and the second control signal PWR is driven "low" during read cycles and high during write cycles. Accordingly, during a read cycle in the 2-bit prefetch mode, the second control signal PWR is driven "low". Thus, as with the operation in the pipeline mode, the internal clock PCLKS is inverted and delayed by the first inverting delayer 91 and the output signal from the first inverting delayer 91 is output as the column selection line enable control signal PCSLE. During a write cycle in the 2-bit prefetch mode, the first control signal P2N is "high" and the second control signal PWR is driven "high". Accordingly, the output signal of the first logic means ND1 is driven "low", and the first switching means TM1 turns off while the second switching means TM2 turns on. Hence, the internal clock PCLKS is inverted and delayed at the first inverting delayer 92, and the output signal from the first inverting delayer 91 is delayed again by the first delayer 92 and output as the column selection line enable control signal PCSLE.

Figure 10:
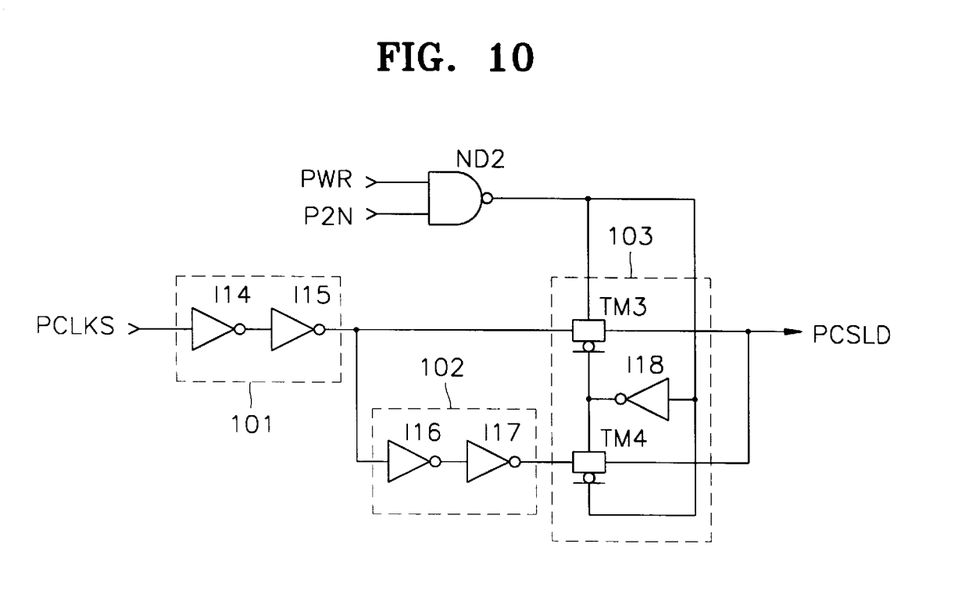
FIG. 10 is a circuit diagram of the column selection line disable control signal generator in the column selection line control circuit shown in FIG. 8.

Referring to FIG. 10, the column selection line disable control signal generator includes a second delayer 101 for delaying the internal clock PCLKS, a third delayer 102 for delaying the output signal from the second delayer 101, a second logic means ND2 for performing a logical operation by receiving the first and second control signals P2N and PWR, and a second selector 103 for selecting one of the output signals from the third delayer 102 and the second delayer 101 in response to the output signal of the second logic means ND2 and outputting the column selection line disable control signal PCSLD.

The second delayer 101 includes an invertor 114 for inverting the internal clock PCLKS and an invertor I15 for inverting the output signal of the invertor I14. The third delayer 102 includes an invertor I16 for inverting the output signal of the invertor I15 and an invertor I17 for inverting the output of the invertor I16. The second logic means ND2 is a NAND gate for performing a NAND operation on the first and second control signals P2N and PWR. The second selector 103 includes a third switching means TM3 for outputting the output signal from the second delayer 101 as the column selection line disable control signal PCSLD in response to the output signal of the second logic means ND2, and a fourth switching means TM4 for outputting the output signal from the third delayer 102 as the column selection line disable control signal PCSLD in response to the inverted output signal of the second logic means ND2. The third and fourth switching means TM3 and TM4 are transmission gates.

The column selection line disable control signal generator operates in a manner similar to the column selection line enable control signal generator shown in FIG. 9, so the operation of only the portion that is different from the column selection line enable control signal generator will now be described. When the synchronous DRAM operates in pipeline mode, the internal clock PCLKS is delayed by the second delayer 101 and the output signal from the second delayer 101 is output as the column selection line disable control signal PCSLD. When the synchronous DRAM operates in a 2-bit prefetch mode, the internal clock PCLKS is delayed by the second delayer 101 and the output signal from the second delayer 101 is output as the column selection line disable control signal PCSLD after being delayed again by the third delayer 102.

Figure 11:
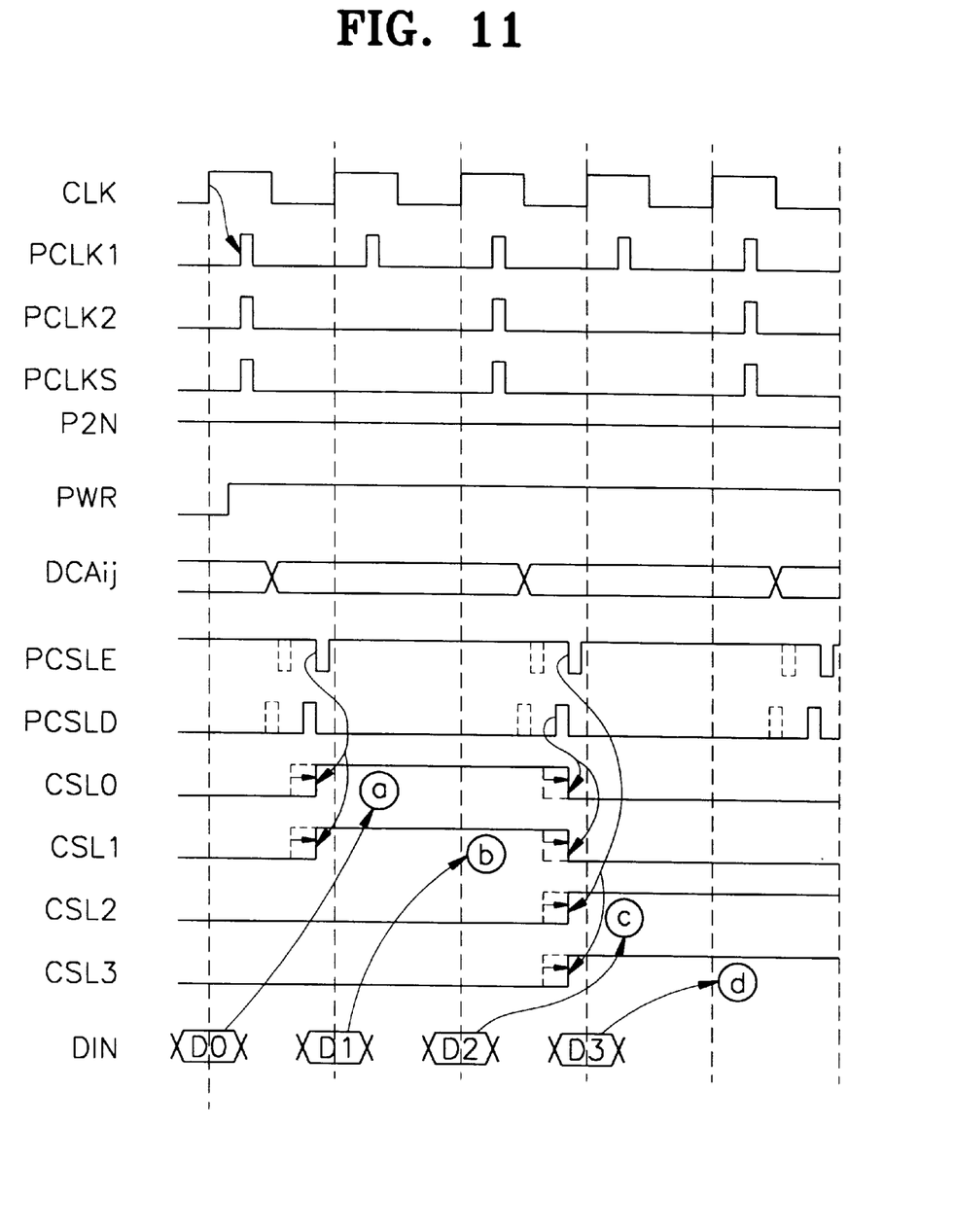
FIG. 11 is a timing diagram showing the operation of the column selection line control circuit shown in FIG. 8 when the synchronous DRAM operates in a 2-bit prefetch mode.

FIG. 11 is a timing diagram for explaining the operation of the column selection line control circuit shown in FIG. 8 when the synchronous DRAM performs a write operation in a 2-bit prefetch mode.

Referring to FIG. 11, the operation of the column selection line control circuit shown in FIG. 8 and the method of controlling a column selection line according to the present invention will now be described. The first internal clock generator 83 receives the external clock CLK which is input from outside of the chip and generates the first internal clock PCLK1 having the same cycle time as that of the external clock CLK. The second internal clock generator 84 receives the first internal clock PCLK1 and generates the second internal clock PCLK2 of which has a cycle that is double that of the first internal clock. When the synchronous DRAM operates in pipeline mode, the selector 85 selects the first internal clock PCLK1 as the internal clock PCLKS. When the synchronous DRAM operates in 2-bit prefetch mode, the selector 85 selects the second internal clock PCLK2 as the internal clock PCLKS.

The column selection line enable control signal generator 82a and the column selection line disable control signal generator 82b receive the first and second control signals P2N and PWR, respectively, and generate control signals C1 and C2 (the output signals of ND1 and ND2 shown in FIGS. 9 and 10) which become active during write operations in the 2-bit mode. As described above, the first control signal P2N is enabled (driven "high") when the synchronous DRAM operates in 2-bit prefetch mode, and the second control signal PWR is enabled (driven "high") during write cycles in the 2-bit prefetch mode.

Next, the column selection line enable control signal generator 82a inverts the internal clock PCLKS and delays the inverted internal clock to output the delayed clock as the column selection line enable control signal PCSLE when the control signal C1 is active. When the control signal C1 is inactive, the inverted internal clock is output without delay as the column selection line enable control signal PCSLE. That is, when the synchronous DRAM performs a write cycle in the 2-bit prefetch mode, the inverted internal clock is delayed and output as the column selection line enable control signal PCSLE.

The column selection line disable control signal generator 82b also delays the internal clock PCLKS for a predetermined time to output the delayed clock as the column selection line disable control signal PCSLD, when the control signal C2 becomes active. When the control signal C2 becomes non-active, the internal clock PCLKS is output without delay as the column selection line disable control signal PCSLD. That is, when the synchronous DRAM performs a write cycle in the 2-bit prefetch mode, the internal clock is delayed and output as the column selection line disable control signal PCSLD. Accordingly, the column decoder 81 enables the column selection lines CSL0, CSL1, CSL2 and CSL3 when the column selection line enable control signal PCSLE becomes active, i.e., at the falling edge. When the column selection line disable control signal PCSLD becomes active, i.e., at the rising edge, the column decoder 81 disables the column selection lines CSL0, CSL1, CSL2 and CSL3. That is, when the synchronous DRAM operates in the 2-bit prefetch mode, the times as which the column selection lines CSL0, CSL1, CSL2 and CSL3 are enabled and disabled are delayed by the delayed due to the delays in the column selection line enable control signal PCSLE and column selection line disable control signal PCSLD.

As described above, when the synchronous DRAM operates in the 2-bit prefetch mode, two column selection lines are enabled for two cycles of the external clock CLK. That is, the column selection lines CSL0 and CSL1 are concurrently enabled at the falling edge of the column selection line enable control signal PCSLE and concurrently disabled at the rising edge of the column selection line disable control signal PCSLD. The column selection lines CSL2 and CSL3 are concurrently enabled at the next falling edge of the column selection line enable control signal PCSLE and concurrently disabled at the next rising edge of the column selection line disable control signal PCSLD. Thus, when the synchronous DRAM performs a write cycle in the 2-bit prefetch mode, the enabling and disabling points of the column selection lines SCL0, CSL1, CSL2 and CSL3 are delayed, and accordingly, the time margin for writing the input data DIN from outside of the chip, i.e., D1, D2, D3 and D4, to the memory cells is increased.

As described above, in a circuit and method for controlling a column selection line in a synchronous DRAM according to the present invention, when the synchronous DRAM performs a write operation in a 2-bit prefetch mode, the time margin for writing input data which is input from outside of the chip is significantly increased by delaying the times at which the column selection lines are enabled and disabled.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A method for controlling a column select line in a synchronous semiconductor memory device, the method comprising:

enabling the column select line, thereby selecting a memory cell;

writing to the selected memory cell while the column select line is enabled;

generating a column select line disable signal responsive to an external clock signal;

disabling the column select line responsive to the column select line disable signal; and delaying the column select line disable signal responsive to a control signal when the memory device operates in a prefetch mode, thereby extending the time for writing to the memory cell.

2. A method according to claim 1 further including:

generating a column select line enable signal responsive to the external clock signal;

enabling the column select line responsive to the column select line enable signal; and delaying the column select line enable signal responsive to the control signal when the memory device operates in a prefetch mode.

3. A method for controlling a column select line in a synchronous semiconductor memory device, the method comprising:

enabling the column select line, thereby selecting a memory cell;

writing to the selected memory cell while the column select line is enabled;

generating a column select line disable signal responsive to an external clock signal;

disabling the column select line responsive to the column select line disable signal;

delaying the column select line disable signal, thereby extending the time for writing to the memory cell;

enabling a second column select line when the first column select line is enabled, thereby selecting a second memory cell;

writing to the second memory cell while the second column select line is enabled; and disabling the second column select line responsive to the column select line disable signal.

4. A method according to claim 3 further including enabling and disabling the first and second column select lines at the same time when the memory device is operating in a prefetch mode.

5. A method according to claim 4 further including delaying the column select line disable signal only during a write operation.

6. A method for controlling a column select line in a synchronous semiconductor memory device, the method comprising:

enabling the column select line, thereby selecting a memory cell;

writing to the selected memory cell while the column select line is enabled;

generating a column select line disable signal responsive to an external clock signal;

disabling the column select line responsive to the column select line disable signal; and delaying the column select line disable signal, thereby extending the time for writing to the memory cell;

wherein generating the column select line disable signal responsive to the external clock signal includes:

generating a first internal clock signal responsive to the external clock signal;

generating a second internal clock signal responsive to the external clock signal;

selecting the first clock signal when the memory device is operating in a prefetch mode;

selecting the second clock signal when the memory device is operating in a pipeline mode; and generating the column select line disable signal responsive to the selected internal clock signal.

7. A method according to claim 6 further including:

generating a column select line enable signal responsive to the selected internal clock signal;

enabling the column select line responsive to the column select line enable signal; and delaying the column select line enable signal.

8. A column select line control circuit for a synchronous semiconductor memory device comprising:

a column decoder for enabling a column select line responsive to a column address and disabling the column select line responsive to a column select line disable signal;

a column select gate coupled to the column decoder to select a memory cell responsive to the column select line; and a disable signal generator coupled to the column decoder for generating the column select line disable signal responsive to a clock signal;

wherein the disable signal generator delays the column select line disable signal responsive to a control signal during a write operation when the memory device operates in a prefetch mode, thereby extending the time for writing to the memory cell.

9. A column select line control circuit according to claim 8 wherein the column decoder enables the column select line responsive to a column select line enable signal, and further including an enable signal generator coupled to the column decoder for generating the column select line enable signal responsive to the clock signal.

10. A column select line control circuit according to claim 9 wherein the enable signal generator delays the column select line enable signal responsive to the control signal during a write operation when the memory device operates in a prefetch mode.

11. A column select line control circuit for a synchronous semiconductor memory device comprising:

a column decoder for enabling a column select line responsive to a column address and disabling the column select line responsive to a column select line disable signal;

a column select gate coupled to the column decoder to select a memory cell responsive to the column select line;

a disable signal generator coupled to the column decoder for generating the column select line disable signal responsive to a clock signal, wherein the disable signal generator delays the column select line disable signal during a write operation, thereby extending the time for writing to the memory cell;

a first internal clock generator for generating a first clock signal responsive to an external clock signal;

a second internal clock generator for generating a second clock signal responsive to the external clock signal; and a selector circuit coupled to the first internal clock generator, the second internal clock generator, and the disable signal generator for selecting the first clock signal when the memory device operates in a pipeline mode, or the second clock signal when the memory device operates in a prefetch mode, and supplying the selected clock signal to the disable signal generator as the clock signal.

12. A column select line control circuit for a synchronous semiconductor memory device comprising:

a column decoder for enabling a column select line responsive to a column address and disabling the column select line responsive to a column select line disable signal;

a column select gate coupled to the column decoder to select a memory cell responsive to the column select line; and a disable signal generator coupled to the column decoder for generating the column select line disable signal responsive to a clock signal;

wherein the disable signal generator delays the column select line disable signal during a write operation, thereby extending the time for writing to the memory cell; and wherein the disable signal generator includes:

a first delay circuit having an input coupled to receive the clock signal, and an output;

a second delay circuit having an input coupled to the output of the first delay circuit, and an output; and a selector circuit having a first input coupled to the output of the first delay circuit, a second input coupled to the output of the second delay circuit, an output coupled to the column decoder to provide the column select line disable signal thereto, wherein the selector circuit couples the output from either the first delay circuit or the second delay circuit to the column decoder depending on the state of a control signal.

13. A column select line control circuit according to claim 12 wherein the selector circuit includes:

a first transmission gate having a current path coupled between the output of the first delay circuit and the column decoder, and a gate coupled to receive the control signal; and a second transmission gate having a current path coupled between the output of the second delay circuit and the column decoder, and a gate coupled to receive the control signal.

14. A column select line control circuit for a synchronous semiconductor memory device comprising:

a column decoder for enabling a column select line responsive to a column address and disabling the column select line responsive to a column select line disable signal;

a column select gate coupled to the column decoder to select a memory cell responsive to the column select line;

a disable signal generator coupled to the column decoder for generating the column select line disable signal responsive to a clock signal; and an enable signal generator coupled to the column decoder for generating the column select line enable signal responsive to the clock signal;

wherein the disable signal generator delays the column select line disable signal during a write operation, thereby extending the time for writing to the memory cell;

wherein the column decoder enables the column select line responsive to a column select line enable signal; and wherein the enable signal generator includes:

a first delay circuit having an input coupled to receive the clock signal, and an output, wherein the enable circuit inverts the clock signal;

a second delay circuit having an input coupled to the output of the first delay circuit, and an output; and a selector circuit having a first input coupled to the output of the first delay circuit, a second input coupled to the output of the second delay circuit, an output coupled to the column decoder to provide the column select line enable signal thereto, wherein the selector circuit couples the output from either the first delay circuit or the second delay circuit to the column decoder depending on the state of a control signal.

15. A column select line control circuit according to claim 14 wherein the selector circuit includes:

a first transmission gate having a current path coupled between the output of the first delay circuit and the column decoder, and a gate coupled to receive the control signal; and a second transmission gate having a current path coupled between the output of the second delay circuit and the column decoder, and a gate coupled to receive the control signal.

16. A column select line control circuit for a semiconductor memory device comprising:

a column decoder for driving a column select line responsive to an address signal, an enable signal, and a disable signal; and a column select line controller coupled to the column decoder for generating the enable signal and the disable signal responsive to an internal clock signal;

wherein the column select line controller delays the assertion of the enable signal and the disable signal responsive to a control signal during a write operation when the memory device operates in a prefetch mode.

17. A column select line control circuit according to claim 16 wherein the column select line controller includes:

means for generating the enable signal responsive to the internal clock signal; and means for generating the disable signal responsive to the internal clock signal.

18. A column select line control circuit according to claim 17 further including means for generating the internal clock signal responsive to an external clock signal at a first frequency when the memory device is operating in the prefetch mode and at a second frequency when the memory device is operating in a pipeline mode.

19. A method according to claim 1 wherein the control signal is a signal for indicating a write operation.

20. A method according to claim 19 further including delaying the column select line disable signal responsive to a second control signal for indicating a prefetch mode.

* * * * *

UNITED STATES PATENT AND TRADEMARK OFFICE
CERTIFICATE OF CORRECTION

PATENT NO.   : 6,055,194
DATED        : April 25, 2000
INVENTOR(S)  : Seo et al.

It is certified that error appears in the above-identified patent and that said Letters Patent is hereby corrected as shown below:

Column 1,
Line 46, "1OiB" should read -- IOiB --.

Column 7,
Line 18, "18" should read -- I8 --.

Column 8,
Line 12, "114" should read -- I14 --.

Column 9,
Line 39, "times as which" should read -- times at which --.
Line 41, "delayed by the delayed due to the delays" should read -- delayed by the delays --.

Signed and Sealed this

Third Day of December, 2002

JAMES E. ROGAN
*Director of the United States Patent and Trademark Office*